United States Patent
Gibbs

(10) Patent No.: US 9,547,045 B2
(45) Date of Patent: Jan. 17, 2017

(54) METHODS AND SYSTEMS FOR DETERMINING A CHARACTERISTIC OF A VEHICLE ENERGY SOURCE

(71) Applicant: GM GLOBAL TECHNOLOGY OPERATIONS LLC, Detroit, MI (US)

(72) Inventor: James C. Gibbs, Brighton, MI (US)

(73) Assignee: GM GLOBAL TECHNOLOGY OPERATIONS, LLC, Detroit, MI (US)

( * ) Notice: Subject to any disclaimer, the term of this patent is extended or adjusted under 35 U.S.C. 154(b) by 228 days.

(21) Appl. No.: 14/172,700

(22) Filed: Feb. 4, 2014

(65) Prior Publication Data

US 2015/0219724 A1 Aug. 6, 2015

(51) Int. Cl.
| | | |
|---|---|---|
| *H02J 7/00* | (2006.01) | |
| *H02J 7/14* | (2006.01) | |
| *G01R 31/36* | (2006.01) | |
| *G01R 19/165* | (2006.01) | |
| *H01M 10/48* | (2006.01) | |
| *H01M 10/44* | (2006.01) | |

(52) U.S. Cl.
CPC ..... *G01R 31/3624* (2013.01); *G01R 19/16542* (2013.01); *G01R 31/362* (2013.01); *G01R 31/3648* (2013.01); *H01M 10/441* (2013.01); *H01M 10/482* (2013.01); *H02J 7/0014* (2013.01); *H02J 7/0021* (2013.01); *H02J 7/0047* (2013.01)

(58) Field of Classification Search
USPC ....... 320/107, 132, 134, 118, 149, 162, 112, 320/146; 324/426, 427, 434, 428, 431, 324/430, 433
See application file for complete search history.

(56) References Cited

U.S. PATENT DOCUMENTS

| | | | | |
|---|---|---|---|---|
| 6,789,026 B2* | 9/2004 | Barsoukov | ......... | G01R 31/3651 320/104 |
| 7,680,613 B2* | 3/2010 | Lim | ....... | H02J 7/0077 320/130 |
| 2003/0052646 A1* | 3/2003 | Minamiura | ......... | B60L 3/0023 320/122 |
| 2005/0046388 A1* | 3/2005 | Tate | ........ | G01R 31/3651 320/132 |
| 2006/0176022 A1* | 8/2006 | Namba | .......... | G01R 31/3651 320/130 |
| 2010/0280777 A1* | 11/2010 | Jin | .......... | B60L 3/0046 702/63 |
| 2012/0191389 A1* | 7/2012 | Wenzler | ........ | G01R 31/3606 702/63 |

(Continued)

*Primary Examiner* — Alexis A Boateng
(74) *Attorney, Agent, or Firm* — Lorenz & Kopf, LLP

(57) ABSTRACT

Methods, apparatus and systems are provided for determining a characteristic of an energy source. One exemplary method involves obtaining a measured current associated with the energy source using a current sensor and obtaining a measured voltage associated with the energy source. In response to identifying an absence of an anomalous condition of the current sensor based on the measured current, the method determines a current-compensated value for the characteristic based at least in part on the measured voltage and the measured current. In response to identifying the anomalous condition of the current sensor based on the measured current, the method determines an uncompensated value for the characteristic based at least in part on the measured voltage.

20 Claims, 3 Drawing Sheets

(56) References Cited

U.S. PATENT DOCUMENTS

| | | | | |
|---|---|---|---|---|
| 2012/0326726 A1* | 12/2012 | Tabuchi | ............. | G01R 31/3648 324/434 |
| 2013/0119921 A1* | 5/2013 | Choe | ....................... | H02J 7/007 320/106 |
| 2013/0271148 A1* | 10/2013 | Maeda | .................. | B60L 3/0046 324/426 |
| 2013/0278221 A1* | 10/2013 | Maeda | .................. | B60L 3/0046 320/134 |
| 2013/0297243 A1* | 11/2013 | Baba | .................. | B60L 11/1861 702/63 |
| 2014/0117936 A1* | 5/2014 | Taniguchi | ............. | H02J 7/0075 320/126 |
| 2014/0320085 A1* | 10/2014 | Chang | .................. | H02J 7/0081 320/112 |
| 2014/0354232 A1* | 12/2014 | Carcouet | ............... | H01M 2/202 320/118 |

* cited by examiner

METHODS AND SYSTEMS FOR DETERMINING A CHARACTERISTIC OF A VEHICLE ENERGY SOURCE

TECHNICAL FIELD

Embodiments of the subject matter described herein generally relate to vehicle systems, and more particularly relate to systems and methods for determining an electrical characteristic, such as the state of charge (SOC), for a vehicle energy source.

BACKGROUND

In recent years, advances in technology have led to substantial changes in the design of automotive vehicles. In particular, electric motors (or electric machines) are finding an increasing number of applications in the automotive industry due to the electrification of the automotive drive system. Electric and/or hybrid vehicles utilize electric motors as either primary or supplemental torque sources in the automotive drive system. In electric and/or hybrid vehicles, the electric motor is typically powered by a rechargeable energy source, such as a battery, using one or more power conversion modules to produce the desired alternating current electrical signals across the stator windings of the electric motor. Additionally, the battery may provide power to other vehicle components, such as, for example, engine control units (ECUs), traction control systems, power steering systems, braking systems, climate control systems, navigation systems, infotainment systems, and the like.

During the operation of an electric and/or hybrid vehicle, it is often desirable to monitor or otherwise track the remaining energy potential of the energy source analogously to the fuel gauge in conventional vehicles. In practice, the current flowing to/from the vehicle batter is often used to determine the remaining state of charge (SOC) of the battery. However, the wide range of possible currents during vehicle operation generally requires the use of current sensors with a wide measurement range, which, in turn, increases costs and/or compromises fidelity. Accordingly, it is desirable to provide systems and methods for accurately determining the SOC while reducing cost. Other desirable features and characteristics will become apparent from the subsequent detailed description and the appended claims, taken in conjunction with the accompanying drawings and the foregoing technical field and background.

SUMMARY

In one of various exemplary embodiments, a method of determining a characteristic of an energy source is provided. The method involves obtaining a measured current for the energy source using a current sensor and obtaining a measured voltage associated with the energy source. In response to identifying an absence of a condition of the current sensor based on the measured current, the method determines a current-compensated value for the characteristic based at least in part on the measured voltage and the measured current. In response to identifying the condition of the current sensor based on the measured current, the method determines an uncompensated value for the characteristic based at least in part on the measured voltage.

In another embodiment, a method of determining a characteristic of an energy source in a vehicle is provided. The method involves obtaining a first voltage measurement for the energy source, obtaining a first current measurement associated with the energy source using a current sensor, identifying a saturation condition of the current sensor based at least in part on the first current measurement, and determining an uncompensated value for the characteristic based at least in part on the first voltage measurement. After identifying the saturation condition, the method obtains a second voltage measurement for the energy source, obtains a second current measurement associated with the energy source using the current sensor, and identifies an absence of the saturation condition based at least in part on the second current measurement. After identifying the absence of the saturation condition, the method determines a first value for the characteristic based at least in part on the first value and the second current measurement, determines a second value for the characteristic based at least in part on the second voltage measurement, and determines a current-compensated value for the characteristic based at least in part on the first value and the second value.

According to another of various exemplary embodiments, an apparatus for a vehicle is provided. The vehicle includes an interface to be coupled to an energy source, a current sensor configured to obtain a measured current associated with the energy source, and a control module coupled to the interface and the current sensor. The control module is configured to obtain a measured voltage associated with the energy source from the interface, determine a current-compensated value for a characteristic of the energy source based at least in part on the measured voltage and the measured current in response to identifying an absence of a condition of the current sensor based on the measured current, and determine an uncompensated value for the characteristic based at least in part on the measured voltage in response to identifying the condition of the current sensor based on the measured current.

DESCRIPTION OF THE DRAWINGS

The exemplary embodiments will hereinafter be described in conjunction with the following drawing figures, wherein like numerals denote like elements, and wherein.

DETAILED DESCRIPTION

Figure 1:
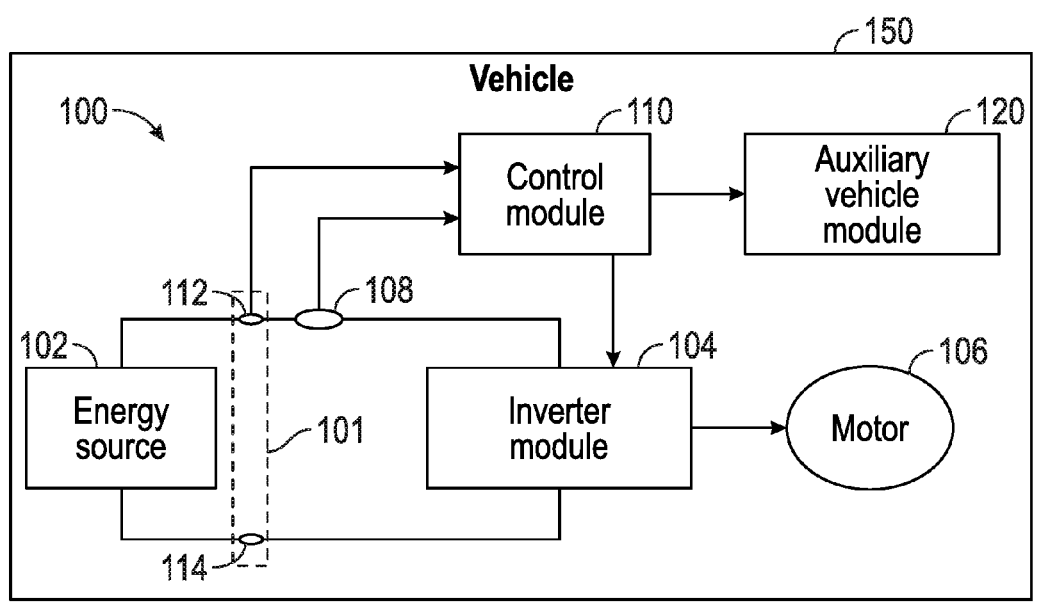
FIG. 1 is a block diagram of an exemplary vehicle electrical system in accordance with one or more embodiments.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Embodiments of the subject matter described herein relate to determining a characteristic of an energy source in a vehicle in a manner that accounts for an anomalous condition of a current sensor that measures a current flowing to/from the energy source. In this regard, in the absence of an anomalous condition of a current sensor, a current-compensated value for the characteristic is determined based at least in part on a measured current obtained from the current sensor and a measured voltage associated with the energy source. On the other hand, in response to identifying an anomalous condition of the current sensor, an uncompensated value for the characteristic is determined based at least in part on the measured voltage associated with the energy source without utilizing the measured current from the current sensor. In exemplary embodiments, when the anomalous condition is temporary or transient, the most recent uncompensated value for the characteristic that was determined when the anomalous condition was present is utilized for determining an updated current-compensated value for the characteristic based at least in part on an updated measured current obtained from the current sensor.

For purposes of explanation, the subject matter is described herein in the context of determining the state of charge (SOC) of a battery (or a combination thereof), however, the subject matter described herein is not necessarily limited to batteries or solely determining the SOC of an energy source. In this regard, the subject matter described herein may be utilized in an equivalent manner to determine the SOC or another electrical characteristic of other types of energy sources. Additionally, while the subject matter may be described herein in the context of dynamically enabling and/or disabling current compensation in response to a saturation condition of the current sensor, the subject matter described herein is not necessarily limited to a saturation condition. In this regard, the subject matter described herein may be utilized in an equivalent manner to dynamically enable and/or disable current compensation in response to any anomalous condition of the current sensor. For example, the current compensation may be disabled while the current sensor is outputting invalid measurement values or other measurement values outside the measurement range of the current sensor, or while communications with the current sensor are interrupted or otherwise being interfered with.

As described in greater detail below, in exemplary embodiments, a measured current flowing to/from a battery is obtained from a current sensor, and a saturation condition of the current sensor is identified based on the measured battery current. In this regard, the absence of a saturation condition is identified when the measured battery current is within the measurement range of the current sensor. Conversely, when the measured battery current is equal to an upper or lower limit of the measurement range, a saturation condition is identified. In the absence of a saturation condition, a current-based SOC value is calculated or otherwise determined based on the measured battery current, and a current-compensated SOC value for the battery is determined as a weighted sum of the current-based SOC value and a voltage-based SOC value determined based on the measured battery current and a measured battery voltage. When a saturation condition is identified, an uncompensated SOC value is determined using solely the voltage-based SOC value (e.g., by setting the weighting factor associated with the current-based SOC value to zero). After identifying a saturation condition, when the saturation condition disappears and the battery current returns to the measurement range of the current sensor, the uncompensated voltage-based SOC value is utilized as an initial reference SOC value for calculating an updated current-based SOC value based on the updated battery current measurement. Thereafter, an updated current-compensated SOC value for the battery is determined as a weighted sum of the updated current-based SOC value and an updated voltage-based SOC value determined based on the updated battery current measurement and an updated battery voltage measurement.

Turning now to FIG. 1, an exemplary electrical system 100 suitable for use in an automotive vehicle 150 includes, without limitation, an input interface 101 adapted to be coupled to an energy source 102, a power conversion module 104, an electric motor 106, at least one current sensor 108, and a control module 110. In the illustrated embodiment, the control module 110 is coupled to the power conversion module 104 and generates commands for operating the power conversion module 104 in a manner that results in the desired operation of the electric motor 106 in response to commands received from the driver of the vehicle 150 (e.g., via an accelerator pedal). The current sensor 108 is coupled between a node 112 of the input interface 101 and the power conversion module 104 to sense, detect, measure or otherwise quantify the current that flows to/from the energy source 102. However, it should be understood that FIG. 1 is a simplified representation of a vehicle electrical system 100 for purposes of explanation and is not intended to limit the scope or applicability of the subject matter described herein in any way. In this regard, in alternative embodiments, the current sensor 108 may be coupled between the power conversion module 104 and the electric motor 106 to sense, detect, measure or otherwise quantify a motor current (or a motor phase current) that correlates or otherwise corresponds to the current that flows to/from the energy source 102, in which case, the current flowing to/from the energy source 102 may be calculated or otherwise determined based on a motor current measured by the current sensor 108.

As described in greater detail below in the context of FIGS. 2-3, in exemplary embodiments, the control module 110 is coupled to the input interface 101 to obtain a voltage measurement indicative of the voltage difference between nodes 112, 114 of the input interface 101 (e.g., the voltage of the energy source 102), and the control module 110 is also coupled to the current sensor 108 to obtain a current measurement indicative of the current flowing to/from the energy source 102. Based at least in part on the obtained energy source voltage measurement and the obtained energy source current measurement, the control module 110 determines an electrical characteristic of the energy source 102 in a manner that accounts for an anomalous operational condition of the current sensor 108. In this regard, based on the current measurement, the control module 110 may detect or otherwise identify a saturation condition, a fault condition, or some other anomalous operational condition of the current sensor 108 that renders the energy source current measurement unreliable. While the current sensor 108 is exhibiting an anomalous condition, the control module 110 determines the characteristic of the energy source 102 without using the current measurement from the current sensor 108. Thereafter, in the absence of that anomalous condition, the control module 110 determines the characteristic of the energy source 102 using the updated energy source current measurement from the current sensor 108. In other words, the control module 110 determines a current-compensated value for the energy source characteristic while the current sensor 108 is not exhibiting an anomalous operational condition and determines an uncompensated value for the characteristic when the current sensor 108 is exhibiting an anomalous operational condition. In this regard, when the current sensor 108 reverts to normal operation after exhibiting an anomalous operational condition, the control module 110 may determine the current-compensated value in a manner that is influenced by the most recent uncompensated value determined when the current sensor 108 was exhibiting the anomalous condition.

Still referring to FIG. 1, in exemplary embodiments, the energy source 102 (or power source) generally represents the component in the vehicle 150 that is capable of providing a direct current (DC) voltage to the power conversion module 104 for operating the electric motor 106. Depending on the embodiment, the energy source 102 may be realized as a battery, a fuel cell, a rechargeable high-voltage battery pack, an ultracapacitor, or another suitable energy source known in the art. That said, in exemplary embodiments, the energy source 102 is realized as one or more rechargeable batteries configured to provide the desired DC voltage for operating the electric motor 106. Accordingly, for purposes of explanation, but without limitation, the energy source 102 is alternatively referred to herein as a battery. In exemplary embodiments described herein, the battery 102 has a nominal open-circuit voltage greater than about 80 Volts and a battery capacity greater than about 4.5 amp-hours for use with an electric motor 106 having a power rating (or power capacity) greater than about 10 kilowatts. Typically, for an automotive application where the electric motor 106 has a power rating (or power capacity) in the range of about 15 kilowatts to about 45 kilowatts, the battery 102 has a nominal open-circuit voltage in the range of about 280 Volts to about 370 Volts and a battery capacity in the range of about 30 amp-hours to about 60 amp-hours. For example, in one embodiment, the battery 102 has a nominal open-circuit voltage of about 345 Volts and a battery capacity of about 45 amp-hours.

The power conversion module 104 generally represents the component in the vehicle 150 that is coupled between the energy source 102 and the electric motor 106 to convert the DC power from the energy source 102 into alternating current (AC) power for driving the electric motor 106. In this regard, in exemplary embodiments, the power conversion module 104 includes a power inverter having one or more phase legs, with each phase leg corresponding to a respective phase of the electric motor 106. Generally, switches of a phase leg are modulated (opened or closed) at a particular switching frequency to produce an AC voltage across its associated phase of stator windings of the electric motor 106, which, in turn, creates torque-producing current in those stator windings and operates the electric motor 106. Again, for purposes of explanation, but without limitation, the power conversion module 104 is alternatively referred to herein as an inverter module 104.

In one exemplary embodiment, the electric motor 106 is realized as an induction motor, however, the subject matter described herein should not be construed as being limited to use with any particular type of electric motor. In other embodiments, the electric motor 106 may be realized as an internal permanent magnet (IPM) motor, a synchronous reluctance motor, or another suitable motor known in the art. Although not illustrated in FIG. 1, the motor 106 may include a transmission integrated therein such that the motor 106 and the transmission are mechanically coupled to at least some of the wheels of the vehicle 150 through one or more drive shafts, so that the speed of the motor 106 (e.g., the rotational velocity of the rotor) influences the speed of the vehicle 150.

In exemplary embodiments, the vehicle 150 is realized as an automobile, and depending on the embodiment, the vehicle 150 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD), or all-wheel drive (AWD). In exemplary embodiments, the vehicle 150 is realized as a fully electric vehicle, a plug-in hybrid vehicle, or the like. However, in various embodiments, the vehicle 150 may be realized as a fuel cell vehicle (FCV) or another suitable alternative fuel vehicle, and/or the vehicle 150 may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen and natural gas) fueled engine, and/or a combustion/electric motor hybrid engine.

As illustrated in FIG. 1, the vehicle electrical system 100 includes at least one current sensor 108 that is coupled between the battery 102 (e.g., at node 112 of the input interface 101) and the inverter module 104 to sense, measure, or otherwise quantify the current flowing to/from the battery 102. For purposes of explanation, the current that is measured or quantified by the current sensor 108 is alternatively referred to herein as the battery current. In exemplary embodiments, the current sensor 108 is realized as a Hall effect sensor or some other type of current sensor that is capable of measuring currents within the range of about −100 Amps to about 50 Amps with a resolution of about 0.1 amps. During operation of an electric motor 106 having an output power in the range of about 15 kilowatts to about 45 kilowatts to provide propulsion torque and/or electric power during regenerative breaking with a battery 102 having a nominal open-circuit voltage in the range of 280 Volts to about 370 Volts, the battery current may range from about −300 amps to about 100 amps. Accordingly, during some periods of operation of the electric motor 106, the battery current may saturate or otherwise exceed the measurement range of the current sensor 108, thereby rendering the battery current measurements from the current sensor 108 potentially inaccurate and/or unreliable during those periods of operation. As described in greater detail below in the context of FIGS. 2-3, in response to identifying a saturation condition, in lieu of determining a current-compensated SOC, the control module 110 determines an uncompensated SOC of the battery 102 until the battery current returns to being within the measurement range of the current sensor 108.

Still referring to FIG. 1, the control module 110 generally represents the hardware of the electrical system 100 that is suitably configured to obtain the battery current measurement from the current sensor 108 and the battery voltage measurement from the input interface 101, and determine the SOC for the battery 102 in a manner that accounts for a saturation condition or another anomalous condition of the current sensor 108. In some embodiments, the control module 110 may be coupled to the input interface 101 indirectly via a voltage sensor (not illustrated) that is configured to measure, sense, or otherwise quantify the voltage difference between the nodes 112, 114 of the input interface 101. In other embodiments, the control module 110 may be coupled directly to the nodes 112, 114 of the input interface 101 and include or otherwise implement a voltage sensing element capable of measuring, sensing, or otherwise quantifying the voltage difference between the nodes 112, 114.

Depending on the embodiment, the control module 110 may be implemented or realized with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions, tasks, operations and/or processes described herein. In this regard, the control module 110 may be realized as a microprocessor, a controller, a microcontroller, a state machine, or the like. The control module 110 may also be implemented as a combination of computing devices, e.g., a combination of a digital signal processor and a microprocessor, a plurality of microprocessors, one or more microprocessors in conjunction with a digital signal processor core, or any other such configuration. In practice, the control module 110 includes processing logic that may be configured to carry out the functions, techniques, and processing tasks associated with the operation of the vehicle electrical system 100, as described in greater detail below in the context of FIGS. 2-3. Furthermore, the steps of a method or algorithm described in connection with the embodiments disclosed herein may be embodied directly in hardware, in firmware, in a software module executed by the control module 110, or in any practical combination thereof. In exemplary embodiments, the control module 110 includes or otherwise accesses a data storage element or memory, including any sort of random access memory (RAM), read only memory (ROM), flash memory, registers, hard disks, removable disks, magnetic or optical mass storage, or any other short or long term storage media or other non-transitory computer-readable medium, which is capable of storing programming instructions for execution by the control module 110. The computer-executable programming instructions, when read and executed by the control module 110, cause the control module 110 to perform various tasks, operations, functions, and processes described herein.

In one or more embodiments, the control module 110 may also be configured to implement field-oriented control or current-regulated control of the electric motor 106 by controlling and/or operating the inverter module 104 to provide a commanded voltage from the battery 102 to the electric motor 106 based at least in part on the measured battery current from the current sensor 108 and/or other measured currents through the stator windings of the electric motor 106 via motor phase current sensors (not illustrated). For example, the control module 110 may regulate the current through the motor 106 to a commanded value by controlling the voltage provided from the battery 102 to the motor 106. Thus, the commanded voltage is a current-regulated voltage configured to regulate currents in the stator windings of the electric motor 106 to particular values.

As illustrated in FIG. 1, the control module 110 may be coupled to one or more additional modules 120 in the vehicle electrical system 100 to output or otherwise provide the current SOC for the battery 102 to the additional module(s) 120. For example, one additional module 120 could be an electronic control unit (ECU) that controls operation of other vehicle modules and/or systems that are powered by the battery 102 based on the current SOC of the battery 102. For example, if the SOC for the battery 102 that is determined and provided by the control module 110 is less than a threshold value, the ECU 120 may adjust or otherwise alter operations of other vehicle modules that may be coupled to the input interface 101 and/or the battery 102 to conserve power and/or consume less current, thereby preserving the state of charge of the battery 102 before recharging. Additionally and/or alternatively, the ECU 120 may be coupled to a display device or a dashboard indicator that graphically presents the current SOC of the battery 102 to the driver of the vehicle 150 in real-time, where the ECU 120 dynamically refreshes and/or updates the graphical indication of the SOC to reflect the current or most recent SOC provided by the control module 110. For example, the ECU 120 may present or otherwise provide a SOC gauge display that indicates the real-time (or current) SOC of the battery 102. In alternative embodiments, the additional module 120 may be realized as a display device or a dashboard indicator that is coupled directly to the control module 110, where the control module 110 dynamically refreshes and/or updates the graphical indication of the SOC (e.g., the SOC gauge) presented by the display module 120 to reflect the current or most recent SOC determined by the control module 110.

Figure 2:
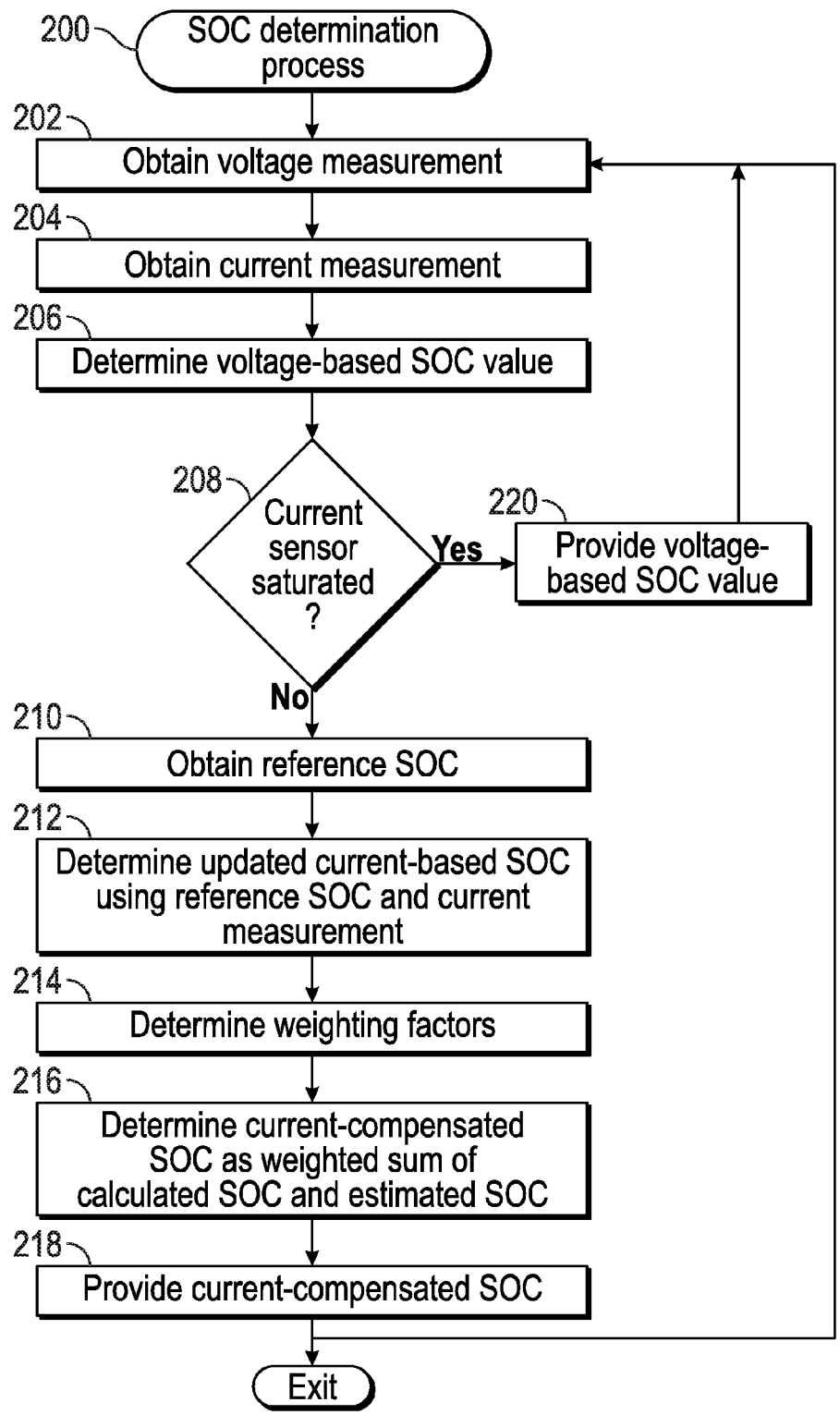
FIG. 2 is a flow diagram illustrating an exemplary state of charge (SOC) determination process suitable for implementation by the vehicle electrical system of FIG. 1 in accordance with one or more embodiments.

FIG. 2 depicts an exemplary embodiment of a SOC determination process 200 for determining the real-time (or current) SOC of an energy source in an electrical system during operation, such as the battery 102 in the vehicle electrical system 100 of FIG. 1 during operation of the vehicle 150. The various tasks performed in connection with the illustrated process 200 may be performed by hardware, suitably configured analog circuitry, software executed by processing circuitry, firmware executable by processing circuitry, or any combination thereof. For illustrative purposes, the following description may refer to elements mentioned above in connection with FIG. 1. In practice, portions of the SOC determination process 200 may be performed by different elements of the vehicle electrical system 100, such as, for example, the current sensor 108, the control module 110, and/or the module 120. It should be appreciated that practical embodiments of the SOC determination process 200 may include any number of additional or alternative tasks, the tasks need not be performed in the illustrated order and/or the tasks may be performed concurrently, and/or the SOC determination process 200 may be incorporated into a more comprehensive procedure or process having additional functionality not described in detail herein. Moreover, one or more of the tasks shown and described in the context of FIG. 2 could be omitted from a practical embodiment of the SOC determination process 200 as long as the intended overall functionality remains intact.

In exemplary embodiments, the SOC determination process 200 begins by obtaining a voltage measurement indicative of the voltage of the energy source and obtaining a current measurement indicative of the current flowing to/from the energy source (tasks 202, 204). In this regard, the control module 110 obtains, from the input interface 101, a battery voltage measurement corresponding to the instantaneous voltage measured between the nodes 112, 114 of the input interface 101. Additionally, the control module 110 obtains, from the current sensor 108, a battery current measurement corresponding to the instantaneous current flowing to/from the node 112. In some embodiments, the control module 110 obtains the battery voltage measurement and the battery current measurement concurrently. For example, the control module 110 may periodically poll the input interface 101 and the current sensor 108 every 100 milliseconds for a new (or updated) instantaneous battery voltage measurement and a new (or updated) instantaneous battery current measurement (e.g., by the SOC determination process 200 periodically repeating at 100 millisecond intervals).

In the illustrated embodiments, the SOC determination process 200 continues by determining a voltage-based SOC of the energy source based at least in part on the obtained voltage measurement (task 206). In this regard, the control module 110 estimates the SOC of the battery 102 based at least in part on the recently obtained battery voltage measurement from the input interface 101. For example, the control module 110 may store or otherwise maintain a previously determined discharge curve for the battery 102 (e.g., using a lookup table) that correlates the open circuit battery voltage to a corresponding SOC of the battery 102. Based on the obtained battery voltage measurement and the obtained battery current measurement, the control module 110 calculates or otherwise estimates the current open circuit battery voltage, and then utilizes the discharge curve to determine an estimated SOC for the battery 102 that corresponds to that estimated open circuit battery voltage.

In exemplary embodiments, the SOC determination process 200 continues by detecting or otherwise identifying whether the current sensor is exhibiting a saturation condition based on the obtained battery current measurement (task 208). The control module 110 compares the obtained battery current measurement to the measurement range for the current sensor 108 to determine whether the battery current measurement is within the measurement range. When the obtained battery current measurement value is substantially equal to an end point of the current sensor measurement range (i.e., an upper or lower limit of the measurement range within a threshold tolerance), the control module 110 identifies a saturation condition of the current sensor 108. In response to identifying a saturation condition, the SOC determination process 200 continues by outputting or otherwise providing, as the current SOC for the energy source, the voltage-based battery SOC that was determined based on the estimated open circuit voltage (task 220). In this regard, the voltage-based estimate of the battery SOC is not compensated or otherwise adjusted to account for the battery current measurement when the battery current is outside of the measurement range of the current sensor 108. The control module 110 may output or otherwise provide the uncompensated voltage-based estimate of the battery SOC as the real-time (or current) SOC to one or more modules 120 in the vehicle 150 for updating the SOC gauge presented to the driver of the vehicle 150 and/or influencing the operation of other modules that are coupled to the battery 102 and/or input interface 101.

Still referring to FIG. 2, in exemplary embodiments, the loop defined by tasks 202, 204, 206, 208 and 220 repeats throughout operation of the vehicle 150 to continually monitor the battery current measurement and detect or otherwise identify when the battery current returns to a value that is within the measurement range of the current sensor 108. For example, as described above, every 100 milliseconds, the control module 110 may obtain a new or updated instantaneous battery voltage measurement from the input interface 101, a new or updated instantaneous battery current measurement from the current sensor 108, determine an updated estimated SOC for the battery 102 based on the updated battery voltage measurement, and determine whether the current sensor 108 is still exhibiting a saturation condition. While the current sensor 108 remains saturated, the control module 110 continues outputting or otherwise providing the updated uncompensated estimated SOC for the battery 102 as the real-time SOC for the battery 102 to the other module(s) 120 in the vehicle 150.

When the SOC determination process 200 determines that the obtained battery current measurement is within the current sensor measurement range, the SOC determination process 200 continues by obtaining a reference SOC value for the energy source and calculating or otherwise determining a current-based SOC value for the energy source based at least in part on the reference SOC value and the obtained battery current measurement (tasks 210, 212). As described in greater detail below in the context of FIG. 3, in exemplary embodiments, the most recent uncompensated voltage-based estimated SOC for the battery 102 is fed back, stored, or otherwise maintained for use as the reference SOC value for the battery 102 when the battery current returns to the measurement range of the current sensor 108. The control module 110 utilizes the reference SOC value as the initial SOC value of the battery 102 when calculating an updated SOC value by integrating the battery current. For example, if a new battery current measurement is obtained every 100 milliseconds, the control module 110 may multiply the most recently obtained battery current measurement by 100 milliseconds to determine an estimated amount of charge that was delivered by the battery 102 over the preceding 100 milliseconds. Based on the total battery capacity, the control module 110 converts the estimated amount of charge delivered to a corresponding SOC delivered which is subtracted from the reference SOC value, resulting in an updated current-based SOC value for the battery 102. For example, for a 40 kilowatt electric motor 106 and an energy source 102 with a nominal open-circuit voltage of about 350 Volts, if the battery capacity is about 60 amp-hours and the measured battery current is equal to 100 amps, the control module 110 determines 0.00277 amp-hours of charge was delivered during the preceding 100 millisecond time interval, which corresponds to 0.000055% SOC delivered over the preceding 100 milliseconds that is to be subtracted from the reference SOC value.

In exemplary embodiments, the SOC determination process 200 continues by determining or otherwise identifying a weighting criterion for the current-based SOC value based on the current operation of the electric motor and determining a current-compensated SOC value for the energy source as a weighted sum of the current-based SOC value and the voltage-based estimated SOC value using the weighting criterion (tasks 214, 216). In this regard, based on the particular operating mode for the electric motor 106 and/or the vehicle 150 the current-based SOC value may be likely to be more accurate than the voltage-based SOC value, or vice versa. For example, at lower currents, the voltage-based SOC value is more reliable than the current-based SOC value, while at higher currents, the current-based SOC value may be more reliable than the voltage-based SOC value. Accordingly, in one or more embodiments, the control module 110 determines or otherwise identifies the weighting criterion based on the magnitude of the battery current measurement, for example, by using a lookup table that correlates the battery current to a respective weighting criterion. After determining the weighting criterion for the current-based SOC value, a current-compensated SOC value may be determined using the equation $SOC_c = \alpha SOC_A + (1-\alpha)SOC_v$, where $\alpha$ is a value between zero and one that represents a weighting factor for the current-based SOC value, $SOC_A$ represents the current-based SOC value, $SOC_v$ represents the voltage-based SOC value, and $SOC_c$ represents the resulting current-compensated SOC value.

After determining the current-compensated SOC value, the SOC determination process 200 continues by outputting or otherwise providing the current-compensated SOC value to one or more modules in the vehicle (task 218). In a similar manner as described above, the control module 110 outputs or otherwise provides the current-compensated SOC value for the battery 102 to one or more modules 120 in the vehicle 150 for updating the SOC gauge presented to the driver of the vehicle 150 and/or influencing the operation of other modules that are coupled to the battery 102 and/or input interface 101. In exemplary embodiments, the SOC determination process 200 repeats throughout operation of the vehicle 150 to periodically obtain an updated SOC value for the battery 102 and update the SOC gauge presented to the driver of the vehicle 150 and/or dynamically adjust the operation of other modules that are coupled to the battery 102 and/or input interface 101. In this regard, in the absence of identifying a saturation condition while the battery current is within the measurement range of the current sensor 108, the control module 110 utilizes the battery current measurements obtained from the current sensor 108 to provide current compensation for SOC values estimated based on the battery voltage measurements. When the control module 110 identifies a potential saturation condition of the current sensor 108, the control module 110 stops utilizing the battery current measurements obtained from the current sensor 108 to provide current compensation and merely outputs the uncompensated SOC values estimated based on the battery voltage measurements obtained while the saturation condition is exhibited by the current sensor 108. Thereafter, in the absence of identifying the saturation condition, the control module 110 resumes utilizing battery current measurements obtained from the current sensor 108 to calculate current-based SOC values and provide current compensation. As described above, when the control module 110 resumes current compensation, the control module 110 utilizes the preceding uncompensated SOC value that was estimated based on the preceding battery voltage measurement as the initial reference value for determining the updated current-based SOC value.

Figure 3:
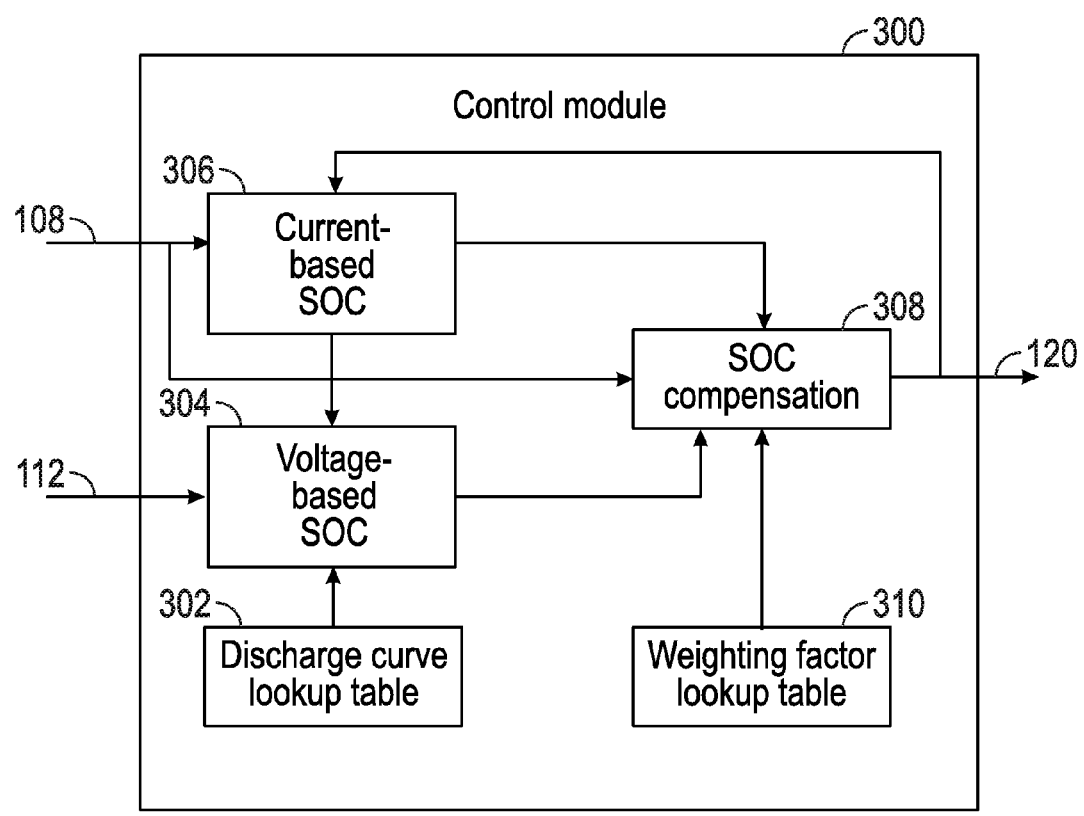
FIG. 3 is a block diagram of an exemplary control module suitable for use in the vehicle electrical system of FIG. 1 in conjunction with the SOC determination process of FIG. 2 in accordance with one exemplary embodiment.

FIG. 3 depicts an exemplary embodiment of a control module 300 suitable for use as the control module 110 in the vehicle electrical system 100 of FIG. 1 in conjunction with the SOC determination process 200 of FIG. 2. The control module 300 includes, without limitation, a first data storage element 302 configured to store or otherwise maintain a discharge curve for the battery 102, a voltage-based SOC determination module 304, a current-based SOC determination module 306, a SOC compensation module 308 coupled to the outputs of the SOC determination modules 304, 306 to calculate or otherwise determine a current-compensated SOC value for the battery 102 in the absence of a saturation condition of the current sensor 108, and a second data storage element 310 configured to store or otherwise maintain weighting factors for the current-compensation.

Referring to FIG. 3 with continued reference to FIGS. 1-2, the first data storage element 302 may be realized using any suitable memory or other non-transitory computer-readable medium capable of storing or otherwise maintaining a discharge curve for the battery 102. In exemplary embodiments, the first data storage element 302 provides a lookup table that correlates the open circuit voltage for the battery 102 to a corresponding SOC of the battery 102. For purposes of explanation, the first data storage element 302 is alternatively referred to herein as the discharge curve lookup table.

Similarly, the second data storage element 310 is realized using any suitable memory or other non-transitory computer-readable medium capable of storing or otherwise maintaining weighting factors for the current-based SOC value. In exemplary embodiments, the second data storage element 310 provides a lookup table that correlates the magnitude of the battery current to a corresponding weighting factor for the current-based SOC value. For purposes of explanation, the data storage element 302 is alternatively referred to herein as the weighting factor lookup table.

In exemplary embodiments, the voltage-based SOC determination module 304 is coupled to the input interface 101 (either directly or indirectly via a voltage sensing arrangement) to obtain a battery voltage measurement corresponding to voltage difference between nodes 112, 114 of the input interface 101. Additionally, the voltage-based SOC determination module 304 is coupled to the current sensor 108 to obtain a battery current measurement corresponding to the current flowing to/from the battery 102. To determine the SOC of the battery 102, the voltage-based SOC determination module 304 estimates the current open circuit voltage of the battery 102 based on the battery voltage measurement and the battery current measurement, for example, by adjusting the measured battery voltage value to compensate for the battery current. Based on the estimated open circuit voltage of the battery 102, the voltage-based SOC determination module 304 accesses the discharge curve lookup table 302 to obtain or otherwise identify a SOC for the battery 102 that corresponds to the estimated open circuit battery voltage. The voltage-based SOC determination module 304 outputs or otherwise provides the voltage-based SOC for the battery 102 to the SOC compensation module 308 for current compensation.

In exemplary embodiments, the current-based SOC determination module 306 is coupled to the current sensor 108 to obtain the battery current measurement corresponding to the current flowing to/from the battery 102. To determine the SOC of the battery 102, the current-based SOC determination module 306 integrates the battery current to determine the amount of charge delivered by the battery 102, converts the delivered charge to a delivered SOC, and subtracts the delivered SOC from the previous SOC of the battery 102. In this regard, the current-based SOC determination module 306 is coupled to the output of the SOC compensation module 308 to receive the previously determined SOC for the battery 102 as an input reference SOC to current-based SOC determination module 306. To integrate the battery current, the current-based SOC determination module 306 multiplies the measured battery current value by the duration of time that has elapsed from the preceding iteration of the SOC determination process 200 to obtain an estimated amount of charge that was delivered by the battery 102 over that preceding duration of time. Based on the total battery capacity, the control module 110 converts the estimated amount of charge delivered to a corresponding SOC delivered, then subtracts the delivered SOC from the reference SOC received from the output of the SOC compensation module 308 to obtain an updated SOC for the battery 102. Thereafter, the current-based SOC determination module 306 outputs or otherwise provides that current-based updated SOC for the battery 102 to the SOC compensation module 308 for current compensation.

Still referring to FIGS. 1-3, the SOC compensation module 308 is coupled to the current sensor 108 to receive or otherwise obtain the battery current measurement and determine whether the current sensor 108 is exhibiting a saturation condition based on the measured battery current value. In the absence of a saturation condition, the SOC compensation module 308 determines appropriate weighting factors for the current-based SOC value and the voltage-based SOC value based on the magnitude of the measured battery current. For example, using the measured battery current value received via the current sensor 108, the SOC compensation module 308 may access the weighting factor lookup table 310 to identify a weighting factor for the current-based SOC value that corresponds to that level of battery current. As described above, in exemplary embodiments, the sum of the weighting factors for the current-based and voltage-based SOC values is equal to one, such that the weighting factor for the voltage-based SOC value may be determined by subtracting from one the weighting factor for the current-based SOC value obtained from the weighting factor lookup table 310. After determining the weighting factors based on the magnitude of the measured battery current, the SOC compensation module 308 calculates or otherwise determines a current-compensated SOC value for the battery 102 as a weighted sum of the current-based SOC value from the current-based SOC determination module 306 and the voltage-based SOC value from the voltage-based SOC determination module 304 and outputs or otherwise provides the current-compensated SOC value to one or more other modules 120 in the vehicle 150. Additionally, the current-compensated SOC value is fed back to the current-based SOC determination module 306 for use as the initial reference SOC value for calculating an updated current-based SOC value on the subsequent iteration of the SOC determination process 200.

As described above, in response to identifying a saturation condition, the SOC compensation module 308 disables or otherwise stops providing current compensation based on the likelihood that the measured battery current value is not a reliable representation of the actual battery current. The SOC compensation module 308 detects or otherwise identifies the measured battery current value obtained from the current sensor 108 is not within the measurement range of the current sensor 108 when the measured battery current value is equal to an endpoint of the measurement range. For example, if the current sensor 108 measurement range goes from −50 amps to 50 amps, the SOC compensation module 308 detects or otherwise identifies a saturation condition of the current sensor 108 when the measured battery current value is equal to either −50 amps or 50 amps. In response to identifying a saturation condition, the SOC compensation module 308 outputs or otherwise provides the voltage-based SOC value from the voltage-based SOC determination module 304 as the output SOC value for the battery 102. For example, in response to identifying the saturation condition, the SOC compensation module 308 may set the weighting factor for the current-based SOC value to be equal to zero and the weighting factor for the voltage-based SOC value to be equal to one such that the output SOC value is not adjusted or compensated using the current-based SOC value. Thus, the SOC compensation module 308 outputs an uncompensated voltage-based SOC value as the real-time (or current) battery SOC when the current sensor 108 is saturated.

As illustrated in FIG. 3, the uncompensated voltage-based SOC value is fed back to the current-based SOC determination module 306 for use as the initial reference SOC value for calculating an updated current-based SOC value on the subsequent iteration of the SOC determination process 200. Thus, when the measured battery current value returns to being within the measurement range for the current sensor 108, the current-based SOC determination module 306 subtracts the delivered SOC from the uncompensated voltage-based SOC value from the previous iteration of the SOC determination process 200 to obtain an updated current-based SOC value for the battery 102. In other words, after a saturation condition has ceased, the current-based SOC determination module 306 determines an updated current-based SOC value based on the battery current measurement and the uncompensated voltage-based SOC value that was previously output by the SOC compensation module 308. Thereafter, the SOC compensation module 308 utilizes that updated current-based SOC value to adjust or otherwise compensate the updated voltage-based SOC value from the voltage-based SOC determination module 304 to obtain an updated current-compensated SOC value, which is then output to the other module(s) 120 in the vehicle 150. In this manner, current compensation is implemented while the battery current is within the measurement range of the current sensor 108 and disabled while the current sensor 108 is saturated, with the control module 300 being capable of transitioning between outputting uncompensated SOC values and providing current compensation by feeding back the uncompensated SOC values for use as an initial reference SOC value when calculating an updated current-based SOC value upon the battery current returning to the measurement range of the current sensor 108.

One benefit of the subject matter described herein is that current-compensated SOC values can be calculated after saturation of the battery current sensor by feeding back the uncompensated SOC values determined while the battery current sensor is saturated. The measurement range of the current sensor can be reduced, thereby improving the resolution of the current sensor and/or reducing cost. For example, the measurement range may be chosen such that the battery current is likely to be within the measurement range during most operating conditions without compromising the ability to provide current compensation by virtue of feeding back uncompensated SOC values determined when the battery current is outside the measurement range as reference SOC values for resuming current compensation when the battery current returns to the measurement range.

For the sake of brevity, conventional techniques related to communications networks, authentication, software updating, automotive electronics and/or electrical systems, and other functional aspects of the subject matter may not be described in detail herein. In addition, certain terminology may also be used herein for the purpose of reference only, and thus are not intended to be limiting. For example, the terms "first", "second" and other such numerical terms referring to structures do not imply a sequence or order unless clearly indicated by the context. Additionally, the foregoing description also refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. As used herein, a "node" means any internal or external reference point, connection point, junction, terminal, signal line, conductive element, or the like, at which a given signal, logic level, voltage, data pattern, current, or quantity is present.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof. Accordingly, details of the exemplary embodiments or other limitations described above should not be read into the claims absent a clear intention to the contrary.

What is claimed is:

1. A method of determining a characteristic of an energy source, the method comprising:
obtaining a measured current associated with the energy source using a current sensor;
obtaining a measured voltage associated with the energy source;
in response to identifying an absence of a saturation condition of the current sensor based on the measured current, determining a current-compensated value for the characteristic based at least in part on the measured voltage and the measured current; and
in response to identifying the saturation condition of the current sensor based on the measured current, determining an uncompensated value for the characteristic based at least in part on the measured voltage.

2. The method of claim 1, wherein determining the current-compensated value for the characteristic comprises:
determining a first value for the characteristic based at least in part on the measured current;
determining a second value for the characteristic based at least in part on the measured voltage; and
determining the current-compensated value as a weighted sum of the first value and the second value.

3. The method of claim 2, wherein determining the current-compensated value as the weighted sum comprises weighting the first value relative to the second value based on the measured current.

4. The method of claim 2, wherein determining the uncompensated value comprises:
determining an estimated voltage based at least in part on the measured voltage and the measured current; and
determining the uncompensated value based on the estimated voltage.

5. The method of claim 1, wherein determining the uncompensated value for the characteristic comprises:
determining an estimated voltage based at least in part on the measured voltage and the measured current; and
determining the uncompensated value based on the estimated voltage.

6. The method of claim 5, wherein determining the current-compensated value for the characteristic comprises:
determining a first value for the characteristic based at least in part on the measured current; and
determining the current-compensated value as a weighted sum of the first value and the uncompensated value.

7. The method of claim 1, further comprising, after identifying the condition of the current sensor:
obtaining a second measured current associated with the energy source using the current sensor;
obtaining a second measured voltage associated with the energy source; and
in response to identifying the absence of the condition of the current sensor based on the second measured current, determining an updated compensated value for the characteristic based at least in part on the second measured voltage, the second measured current, and the uncompensated value.

8. The method of claim 7, wherein determining the uncompensated value for the characteristic comprises:
determining an estimated voltage based at least in part on the measured voltage and the measured current; and
determining the uncompensated value based on the estimated voltage.

9. The method of claim 8, wherein determining the updated compensated value comprises:
determining a first value for the characteristic based at least in part on the second measured current and the uncompensated value;
determining a second estimated voltage based at least in part on the second measured voltage and the second measured current;
determining a second value for the characteristic based on the second estimated voltage; and
determining the updated compensated value as a weighted sum of the first value and the second value.

10. A method of determining a characteristic of an energy source, the method comprising:
obtaining a measured current associated with the energy source using a current sensor;
obtaining a measured voltage associated with the energy source;
monitoring the measured current for a saturation condition;
determining a current-compensated value for the characteristic in response to identifying the absence of the saturation condition of the current sensor when the measured current is within a measurement range of the current sensor; and
determining an uncompensated value for the characteristic in response to identifying the saturation condition of the current sensor when the measured current is not within the measurement range of the current sensor.

11. The method of claim 10, wherein identifying the saturation condition of the current sensor when the measured current is not within the measurement range of the current sensor comprises identifying the saturation condition when the measured current is equal to a limit of the measurement range.

12. The method of claim 1, wherein:
the measured voltage comprises a first voltage measurement for the energy source;
the measured current comprises a first current measurement associated with the energy source; and
the method further comprises after identifying the saturation condition:
obtaining a second voltage measurement for the energy source;
obtaining a second current measurement associated with the energy source using the current sensor;
identifying the absence of the saturation condition based at least in part on the second current measurement; and
after identifying the absence of the saturation condition:
determining a first value for the characteristic based at least in part on the first value and the second current measurement;
determining a second value for the characteristic based at least in part on the second voltage measurement; and
determining the current-compensated value for the characteristic based at least in part on the first value and the second value.

13. The method of claim 12, the energy source comprising a battery configured to operate an electric motor in the vehicle, wherein:

determining the uncompensated value comprises determining an uncompensated state of charge of the battery based at least in part on the first voltage measurement;

determining the first value comprises determining a current-based state of charge of the battery based at least in part on the uncompensated state of charge of the battery and the second current measurement;

determining the second value comprises determining a second uncompensated state of charge of the battery based at least in part on the second voltage measurement; and determining the current-compensated value comprises determining a weighted sum of the current-based state of charge of the battery and the second uncompensated state of charge of the battery.

14. The method of claim 12, wherein identifying the saturation condition comprises identifying the first current measurement is equal to a limit of a measurement range of the current sensor.

15. A vehicle comprising:
an interface to be coupled to an energy source;
a current sensor to obtain a measured current associated with the energy source; and
a control module coupled to the interface and the current sensor to perform the method of claim 1.

16. The vehicle of claim 15, further comprising:
an electric motor; and
a power conversion module coupled between the interface and the electric motor to provide power from the energy source to the electric motor to operate the electric motor, wherein the current flowing between the energy source and the electric motor during operation of the electric motor exceeds a measurement range of the current sensor.

17. The method of claim 1, wherein:
the energy source comprises a battery; and
the characteristic comprises a state of charge of the battery.

18. The method of claim 1, wherein a measurement range of the current sensor is capable of being exceeded during operation of a vehicle.

19. The vehicle of claim 15, wherein after identifying the condition of the current sensor, the control module is configured to:
obtain a second measured current associated with the energy source from the current sensor;
obtain a second measured voltage associated with the energy source from the interface; and
in response to identifying the absence of the condition of the current sensor based on the second measured current, determine an updated compensated value for the characteristic based at least in part on the second measured voltage, the second measured current, and the uncompensated value.

20. A method of determining a state of charge of an energy source, the method comprising:
obtaining a measured current associated with the energy source using a current sensor;
obtaining a measured voltage associated with the energy source;
in response to identifying an absence of a saturation condition of the current sensor based on the measured current when the measured current is within a measurement range of the current sensor, determining a current-compensated value for the state of charge based at least in part on the measured voltage and the measured current, wherein the current-compensated value comprises a weighted sum of a first value for the state of charge determined based at least in part on the measured current and a second value for the state of charge determined based at least in part on the measured voltage;
in response to identifying the saturation condition of the current when the measured current is not within the measurement range of the current sensor, determining an uncompensated value for the state of charge based at least in part on the measured voltage; and
in response to identifying the absence of the saturation condition of the current sensor after identifying the saturation condition, determining an updated compensated value for the state of charge based at least in part on a second measured voltage, a second measured current, and the uncompensated value.

* * * * *